United States Patent
Onodera

(10) Patent No.: US 10,110,996 B2
(45) Date of Patent: Oct. 23, 2018

(54) DC DETECTION CIRCUIT AND OPERATIONAL METHOD OF THE SAME, SEMICONDUCTOR APPARATUS, AND AUDIO SIGNAL OUTPUT APPARATUS

(71) Applicant: ROHM CO., LTD., Ukyo-Ku, Kyoto (JP)

(72) Inventor: Takeshi Onodera, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 36 days.

(21) Appl. No.: 15/457,107

(22) Filed: Mar. 13, 2017

(65) Prior Publication Data
US 2017/0265000 A1 Sep. 14, 2017

(30) Foreign Application Priority Data
Mar. 14, 2016 (JP) .................. 2016-049163

(51) Int. Cl.
*G10L 21/0208* (2013.01)
*H04R 3/00* (2006.01)
*G01R 19/25* (2006.01)
*H04R 29/00* (2006.01)

(52) U.S. Cl.
CPC ......... *H04R 3/007* (2013.01); *G01R 19/2506* (2013.01); *H04R 29/001* (2013.01)

(58) Field of Classification Search
CPC .... G01N 29/11; G01R 19/2506; G05B 19/07; H02M 7/53873; H04R 3/007

USPC .................. 381/55, 58, 59, 86, 94.1
See application file for complete search history.

(56) References Cited

U.S. PATENT DOCUMENTS 6,577,737 B1 *  6/2003  Krochmal ............... H03F 1/303
                                                   381/120

OTHER PUBLICATIONS

"ISO 26262-1:2011", [online], published Nov. 11, 2015, International Organization for Standardization, [retrieved on Feb. 17, 2016], www.iso.org/obp/ui/#iso:26262:-1:ed-1:v1:en.

* cited by examiner

*Primary Examiner* — George C Monikang
(74) *Attorney, Agent, or Firm* — Cantor Colburn LLP

(57) ABSTRACT

The DC detection circuit includes: a OR circuit configured to generate a logical OR flag on the basis of logical OR of values of X bits from a $(MSB-1)^{th}$ bit to a $(MSB-X)^{th}$ bit of input data; a NAND circuit configured to generate a NAND flag on the basis of a NAND of values of X bits from the $(MSB-1)^{th}$ bit to the $(MSB-X)^{th}$ bit of the input data; a counter configured to count up and a counter value which outputs a DC detection flag if a counter value is exceeds predetermined set value on the basis of the MSB and any one of the logical OR flags of NAND flags. Accordingly, safety can be secured by detecting whether the DC data is included in the input PCM data, and thereby preventing degradation and breakage of the loudspeaker etc. due to the DC data.

19 Claims, 12 Drawing Sheets

DC DETECTION CIRCUIT AND OPERATIONAL METHOD OF THE SAME, SEMICONDUCTOR APPARATUS, AND AUDIO SIGNAL OUTPUT APPARATUS

CROSS REFERENCE TO RELATED APPLICATIONS

This application is based upon and claims the benefit of priority from prior Japanese Patent. Application No. P2016-49163 filed on Mar. 14, 2016, the entire contents of which are incorporated herein by reference.

FIELD

Embodiments described herein relate to a direct current (DC) detection circuit, an operating method of such a DC detection circuit, a semiconductor device, and an audio signal output apparatus.

BACKGROUND

Standards of safety functions (e.g., functions, such as fail-safe, abnormality detections, and safety stops) for all parts mounted in vehicles have been improved. In particular, most of on-vehicle instruments are controlled electrically/electronically, and therefore important needs are not only higher performance and advanced features but also securing safety. It is no exception, for example in an on-vehicle audio/video system.

There has been developed International Organization for Standardization (ISO) 26262 of systematically collecting the development methods of safety on-vehicle equipment, management systems, etc.

SUMMARY

Since constant currents continue flowing into loudspeakers, for example, if direct current (DC) data is included in PCM data input into audio systems, e.g. on-vehicle audio apparatus, such loudspeakers will produce heat and thereby cause breakage or degradation.

The embodiments provide a DC detection circuit, an operating method of such a DC detection circuit, a semiconductor device, and an audio signal output apparatus, wherein safety can be secured by detecting whether DC data is included in input PCM data, and thereby preventing degradation and breakage of loudspeakers etc. due to the DC data.

According to one aspect of the embodiments, there is provided a DC detection circuit comprising: an OR circuit configured to generate a logical OR flag on the basis of a logical OR of values of X bits from a (most significant bit-1)$^{th}$ bit to a (most significant bit-X)$^{th}$ bit of PCM data to be input; an NAND circuit configured to generate an NAND flag on the basis of negative AND of values of X bits from the (most significant bit-1)$^{th}$ to the (most significant bit-X)$^{th}$ bit of the PCM data; and a counter configured to count up a counter value on the basis of the most significant bit and any one of the logical OR flag or NAND flag, and then output a DC detection flag if a counter value exceeds a predetermined set value.

According to another aspect of the embodiments, there is provided a semiconductor apparatus comprising: a DC detection circuit comprising an OR circuit configured to generate a logical OR flag on the basis of a logical OR of values of X bits from a (most significant bit-1)$^{th}$ bit to a (most significant bit-X)$^{th}$ bit of PCM data to be input, an NAND circuit configured to generate an NAND flag on the basis of negative AND of values of X bits from the (most significant bit-1)$^{th}$ bit to the (most significant bit-X)$^{th}$ bit of the PCM data and a counter configured to count up a counter value on the basis of the most significant bit and any one of the logical OR flag or NAND flag, and then output a DC detection flag if a counter value exceeds a predetermined set value; and an error control circuit configured to execute a function for protecting a load from an over current and over temperature due to DC data in response to the DC detection flag sent from the DC detection circuit, and then outputs a load protection flag.

According to still another aspect of the embodiments, there is provided an audio signal output apparatus comprising: a digital signal processor configured to input PCM data; an oversampling filter connected to the digital signal processor; a digital/analog converter connected to the oversampling filter; a comparator connected to the digital/analog converter; a driver output stage connected to the comparator; a loudspeaker connected to the driver output stage; a DC detection circuit comprising an OR circuit configured to generate a logical OR flag on the basis of a logical OR of values of X bits from a (most significant bit-1)$^{th}$ bit to a (most significant bit-X)$^{th}$ bit of the PCM data, an NAND circuit configured to generate an NAND flag on the basis of negative AND of values of X bits from the (most significant bit-1)$^{th}$ bit to the (most significant bit-X)$^{th}$ bit of the PCM data and a counter configured to count up a counter value on the basis of the most significant bit and any one of the logical OR flag or NAND flag, and then output a DC detection flag if a counter value exceeds a predetermined set value; and an error control circuit configured to execute a function for protecting a load from an over current and over temperature due to DC data in response to the DC detection flag sent from the DC detection circuit, and then outputs a load protection flag to the driver output stage.

According to yet another aspect of the embodiments, there is provided an operational method of a DC detection circuit, the operational method comprising: generating, by an OR circuit, a logical OR. flag on the basis of a logical OR of values of X bits from a (most significant bit-1)$^{th}$ bit to a (most significant bit-X)$^{th}$ bit of PCM data to be input; generating, by an NAND circuit, an NAND flag on the basis of negative AND of values of X bits from the (most significant bit-1)$^{th}$ bit to the (most significant bit-X)$^{th}$ bit of the PCM data; and counting up, by a counter, a counter value on the basis of the most significant bit and any one of the logical OR flag or NAND flag, and then output a DC detection flag if a counter value exceeds a predetermined set value.

According to the embodiments, there can be provided the DC detection circuit, the operating method of such a DC detection circuit, the semiconductor device, and the audio signal output apparatus, wherein the safety can be secured by detecting whether the DC data is included in the input PCM data, and thereby preventing degradation and breakage of the loudspeakers etc. due to the DC data.

DESCRIPTION OF EMBODIMENTS

Figure 1:
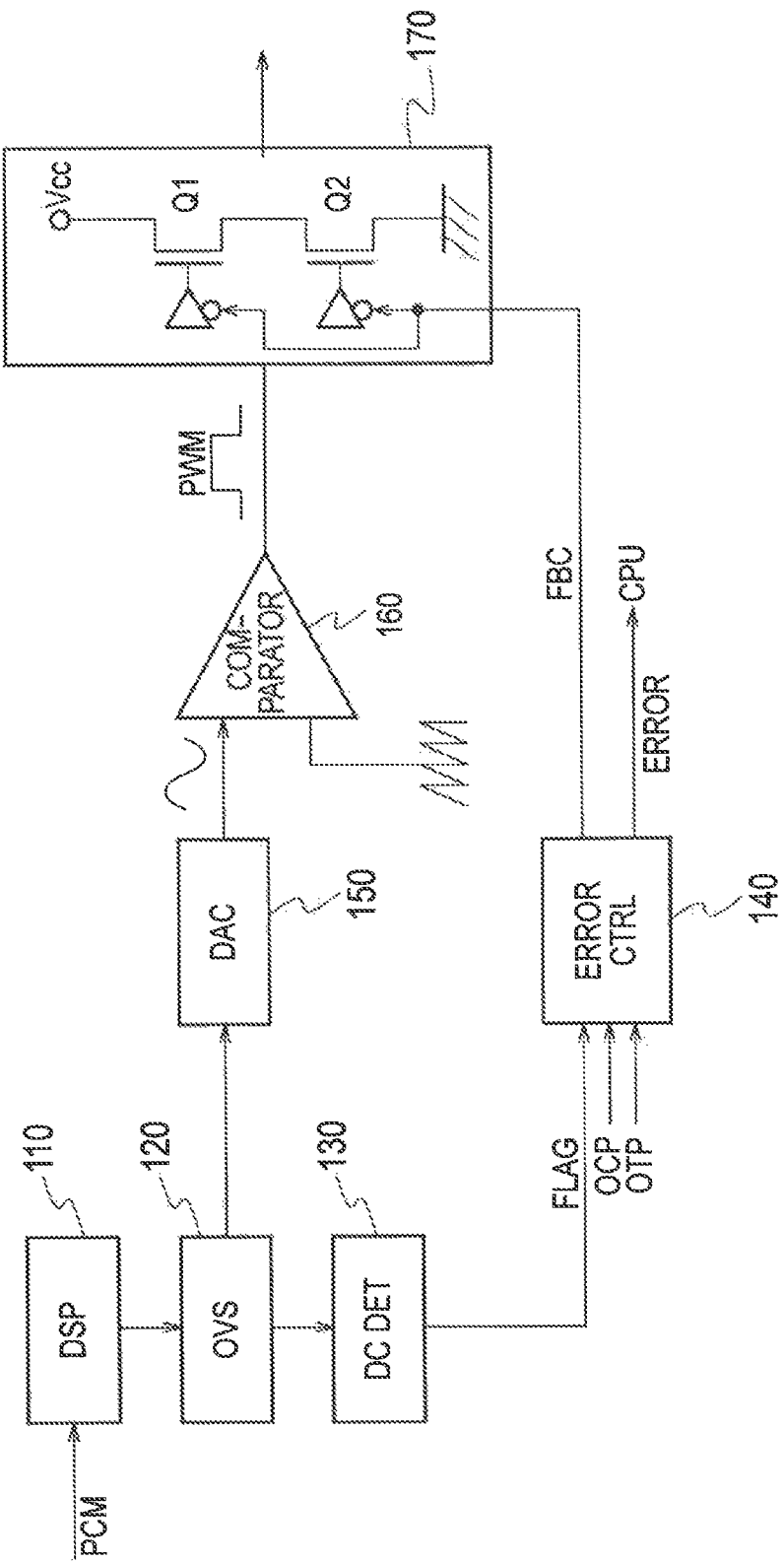
FIG. 1 is a schematic configuration diagram of an audio anal output apparatus to which a DC detection circuit and an error control circuit according to an embodiment are applied.

Next, the embodiments will be described with reference to drawings. In the description of the following drawings, the identical or similar reference numeral is attached to the identical or similar part. However, it should be noted that the drawings are schematic and the relation between thickness and the plane size and the ratio of the thickness thereof differs from an actual thing. Therefore, detailed thickness and size should be determined in consideration of the following explanation. Of course, the part from which the relation and ratio of a mutual size differ also in mutually drawings is included.

Moreover, the embodiments described hereinafter merely exemplify the device and method for materializing the technical idea; and the embodiment does not specify the material, shape, structure, placement, etc. of each component part as the following. The embodiments may be changed without departing from the spirit or scope of claims.

Embodiment

DC Detection Circuit and Error Control Circuit

Figure 2:
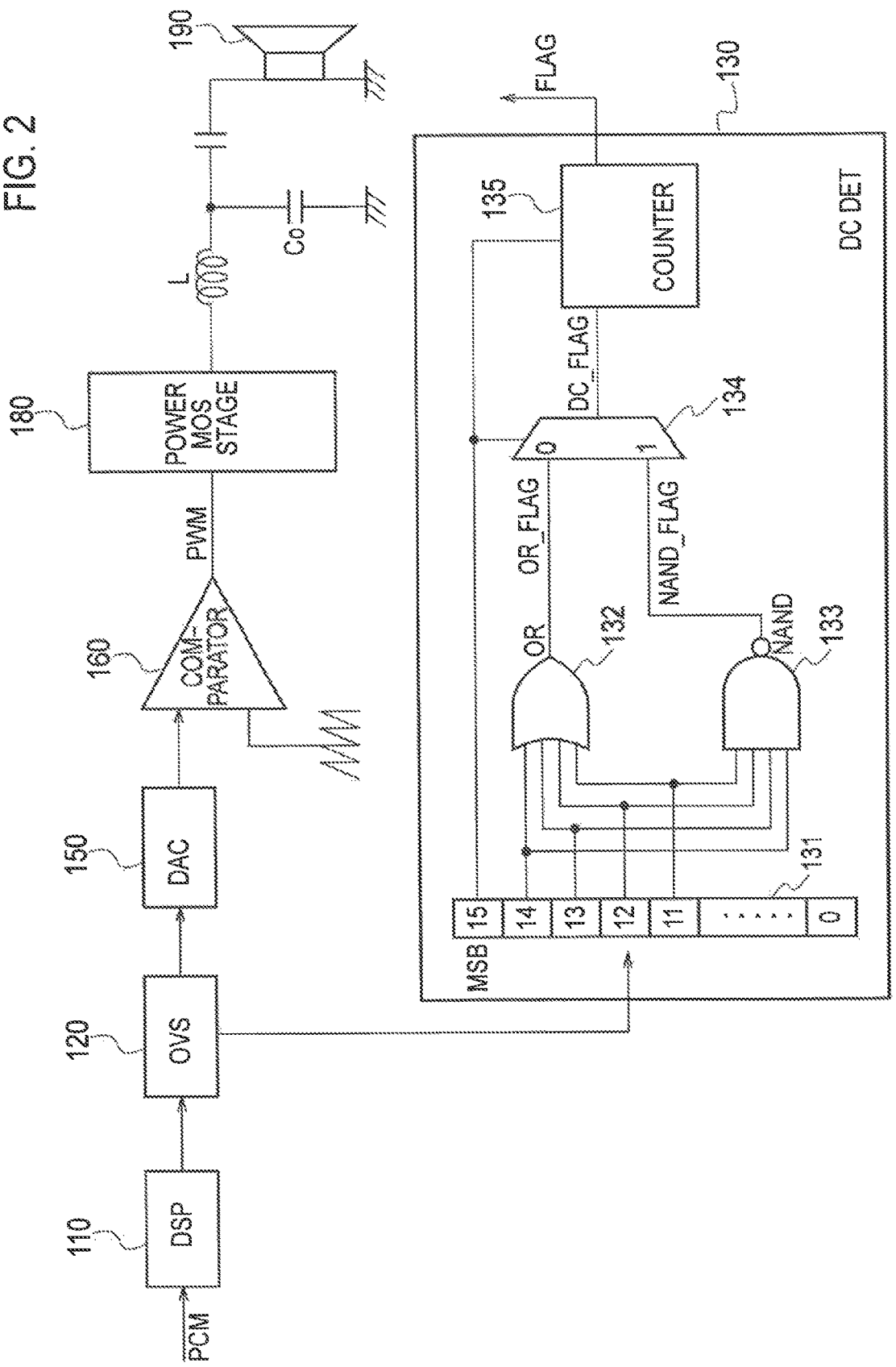
FIG. 2 is a schematic configuration diagram showing an example of an internal configuration of the DC detection circuit included in audio signal output apparatus shown in FIG. 1.

FIG. 1 schematically shows a configuration of an audio signal output apparatus to which a DC detection circuit 130 and an error control circuit 140 according to the embodiment are applied. FIG. 2 schematically shows an example of an internal configuration of the DC detection circuit 130 in the audio signal output apparatus shown in FIG. 1.

The audio signal output apparatus includes: a digital signal processor (DSP) 110 configured to input PCM data; an oversampling filter (OVS) 120 connected to the DSP 110; a digital/analog converter (DAC) 150 connected to the OVS 120; a comparator 160 connected to the DAC 150; a power MOS transistor(s) stage 180 connected to the comparator 160; and a loudspeaker 190 connected to the power MOS stage 180, wherein the audio signal output apparatus further includes: a DC detection circuit (DC DET) 130 according to the embodiment connected to the OVS 120; and an error control circuit (ERROR CTRL) 140 connected to the DC detection circuit 130.

The DSP 110 receives PCM data having formats, such as I2S (Inter-IC Sound), Left justified, Right justified, etc., and executes audio signal processing, e.g. gain control and tone control, and then outputs the processed data to the OVS 120. The OVS 120 executes oversampling of the digital signal outputted from the DSP 110, and then outputs the oversampled digital signal to the DAC 150. The DAC 150 converts the digital signal into an analog signal. The comparator 160 executes Pulse Width Modulation (PWM) of the analog signal received from the DAC 150 with a triangular wave, and then outputs the modulated analog signal to the power MOS stage 180. An output from the power MOS stage 180 is output to a loudspeaker 190 through a lowpass filter (L, $C_0$).

Figure 3:
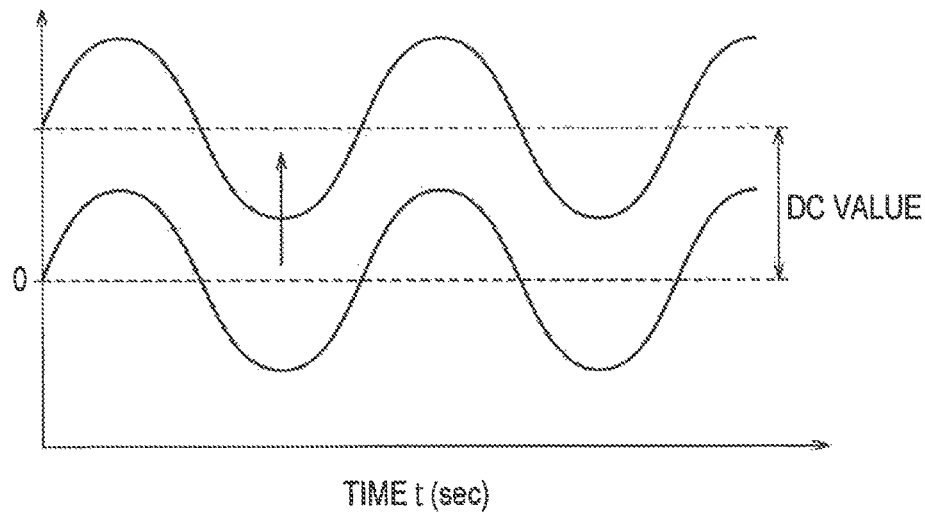
FIG. 3 is a schematic diagram showing an example of an audio signal input into the DC detection circuit according to the embodiment.

At this point, as shown in FIG. 3, since a constant current continues flowing into the loudspeaker 190 if DC data (DC value) is included in the PCM data received, the loudspeaker 190 will produce heat and thereby cause breakage or degradation in a short time.

Accordingly, the audio signal output apparatus according to the embodiment includes: the DC detection circuit 130 configured to detect whether DC data is included in the input PCM data, and then output a DC detection flag FB if the DC data is detected; and the error control circuit 140 configured to execute over current protection (OCP) and/or over temperature protection (OTP) for preventing degradation and breakage of the loudspeaker etc. due to the DC data, in response to the DC detection flag FB sent from the DC detection circuit 130, and then output a load protection flag (FBC).

The OCP is a function for protecting a load (e.g., loudspeaker 190) from electric currents equal to or greater than estimated amounts of current, and is a function for interrupting the output when excessive currents flow. The OTP is a function for protecting the load (e.g., loudspeaker 190) from temperatures equal to or greater than estimated amounts thereof, and is a function for interrupting the output when a temperature exceeds a predetermined temperature due to a certain cause.

Figure 4:
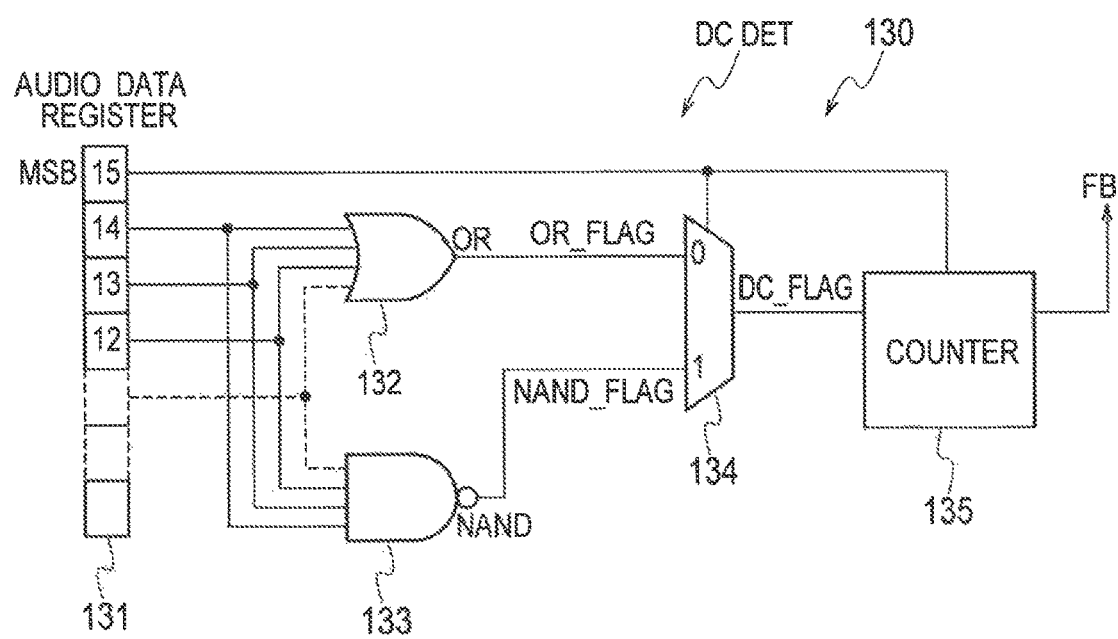
FIG. 4 is a schematic diagram showing an example of an internal configuration of the DC detection circuit according to the embodiment.

FIG. 4 schematically shows an example of an internal configuration of the DC detection circuit 130 according to the embodiment.

The DC detection circuit 130 includes: a register 131 configured to hold an input PCM data (output from the OVS 120); a logical OR (OR) circuit 132 configured to generate a logical OR flag (OR_FLAG) on the basis of logical OR of values of X bits from a (most significant bit (MSB)-1)$^{th}$ bit to a (MSB-X)$^{th}$ bit of the PCM data held by the register 131; a negative AND (NAND) circuit 133 configured to generate a NAND flag (NAND_FLAG) on the basis of NAND of values of X bits from the (MSB-1)$^{th}$ bit to the (MSB-X)$^{th}$ bit of the PCM data similarly held by the register 131; a selector 134 configured to select any one of the logical OR flag (OR_FLAG) or the NAND flags (NAND_FLAG) on the basis of the MSB used as a sign bit, and then output the selected. flag as a DC flag (DC_FLAG); and a counter 135 configured to count up a counter value on the basis of the MSB and the DC flag (DC_FLAG), and then output a DC detection flag FB when the counter value exceeds a predetermined set value.

The register 131 holds the input PCM data. If the bit number of the PCM data is M bits, the N$^{th}$ bit is the MSB and the 0$^{th}$ bit is the least significant bit (LSB), where (M−1)=N. The register 131 shown in FIGS. 1 and 4 holds 16 bits of the PCM data (M=16), and therefore the 15$^{th}$ bit is the MSB and the 0$^{th}$ bit is the LSB.

In this case, a variable X in the (MSB-X) bit is integers equal to or less than 2 but equal to or greater than N. A threshold of the DC detection is approximately −12.04 dB if the variable X is 2, and is approximately −18.06 dB if the variable X is 3. Accordingly, a value obtained by multiplying the variable X by approximately −6.02 dB is the threshold of the DC detection. Thus, the threshold of the DC detection can be determined in accordance with the value of the variable X. A DC detection level is a value calculated by the following equation (1):

$$\text{Detection level}=20\times\text{LOG}(1/(2^x)) \qquad (1)$$

If at least one of the bit values from the (MSB-1)$^{th}$ bit to the (MSB-X)$^{th}$ bit is the high level (logical value "1"), the OR circuit 132 sets up the logical OR flag (OR_FLAG) as a high level (logical value "1"), and then outputs the logical OR flag.

Only if all the bit values from the (MSB-1)$^{th}$ bit to the (MSB-X)$^{th}$ bit are logical values "1", the NAND circuit 133 sets up the NAND flag (NAND_FLAG) as a low level (logical value "0"), and then outputs the NAND flag.

The selector 134 inputs the MSB which is a sign bit, and then selects the logical OR flag (OR_FLAG) as the DC flag (DC_FLAG) if the MSB is a logical value "0". Otherwise, if the MSB is the logical value "1", the selector 134 selects the NAND flag (NAND_FLAG) as the DC flag (DC_FLAG)

The counter 135 inputs the MSB and the DC flag (DC_FLAG), and then executes counter processing for every sampling rate. More specifically, the counter 135 counts up a counter value if the DC flag (DC_FLAG) is the logical value "1" and the counter value is less than a predetermined set value. If the DC flag (DC_FLAG) is the logical value "1" and the counter value is equal to or greater than the predetermined set value, the counter 135 holds the counter value. If the DC flag (DC_FLAG) is the logical value "0" or the value of MSB is changed, the counter 135 clears the counter value. Subsequently, if the counter value exceeds the predetermined set value, the counter 135 regards that DC data is detected, and then outputs the DC detection flag FB.

Thus, according to the DC detection circuit 130 according to the embodiment, the DC detection circuit 130 can be realized by a simplifying and inexpensive structure including only the OR circuit 132, the NAND circuit 133, and the counter 135. Accordingly, the DC detection circuit 130 according to the embodiment can be mounted also in relatively large-sized devices (e.g., device of which a gate width is approximately 0.35 μm), and thereby a reliability of the devices can be improved.

Figure 5A:
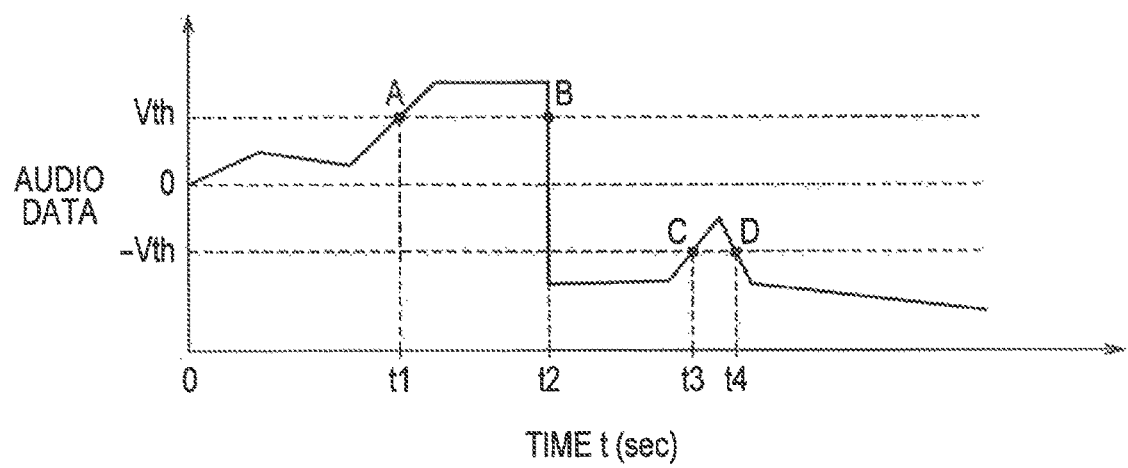
FIG. 5A is a schematic diagram for exemplifying an audio signal input into the DC detection circuit according to the embodiment.
Figure 5B:
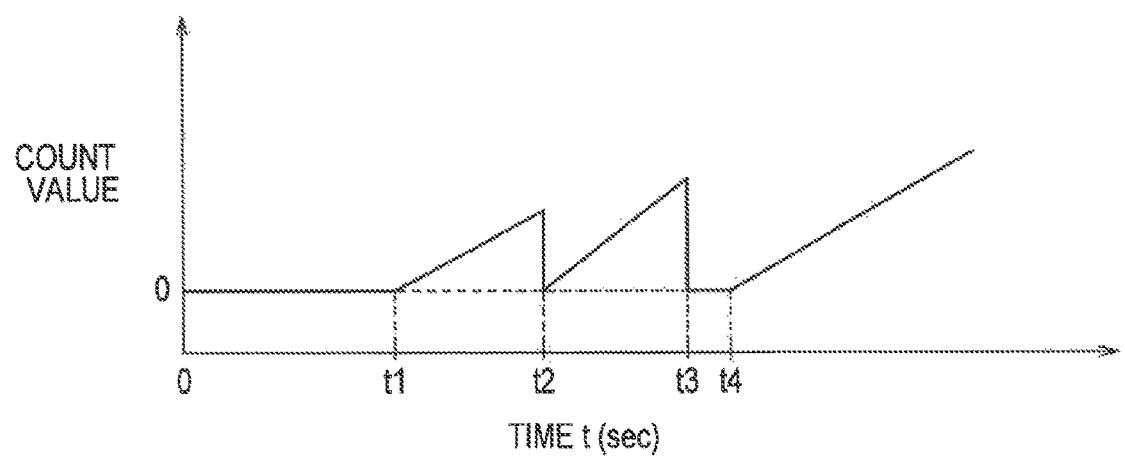
FIG. 5B is a schematic diagram for exemplifying a counter value counted in the DC detection circuit.

FIG. 5 schematically shows a relationship between an audio signal which is audio data input into the DC detection circuit 130 (FIG. 5A) and a counter value counted in the DC detection circuit 130 (FIG. 5B).

In time t1, if a signal level of the input audio data exceeds a predetermined threshold value (Point A), the counter 135 starts count-up of a counter value. Next, in time t2, if the signal level of the audio data is lower than predetermined threshold value (Point B), the counter 135 clears the counter value. Simultaneously, in time t2, if the signal level of the audio data exceeds the predetermined threshold value again, the counter 135 restarts count-up of the counter value. Next, in time t3, if the signal level of the audio data is lower than the predetermined threshold value (Point C), the counter 135 clears the counter value. Next, in time t4, if the signal level of the audio data exceeds the predetermined threshold value, the counter 135 restarts count-up of the counter value.

Figure 6A:
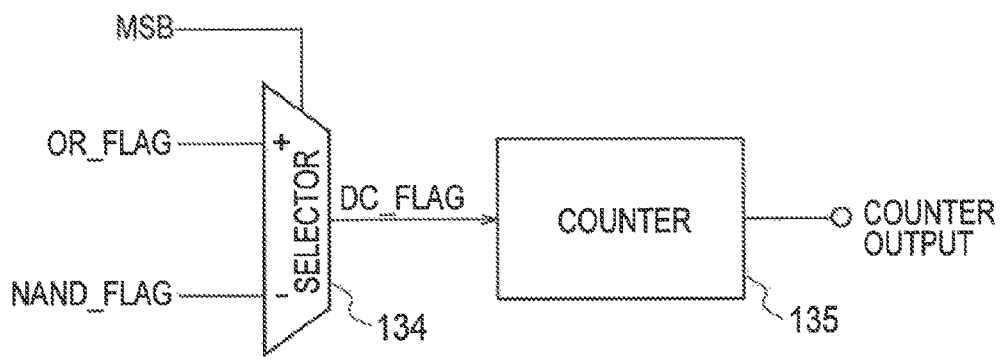
FIG. 6A shows a configuration example of a selector and a counter installed in the DC detection circuit according to the embodiment.
Figure 6B:
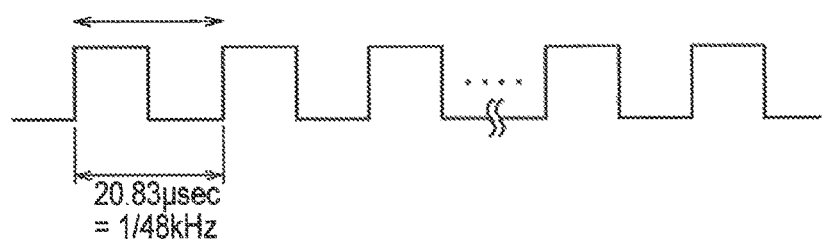
FIG. 6B is a schematic diagram showing an example of timing of counting.
Figure 7:
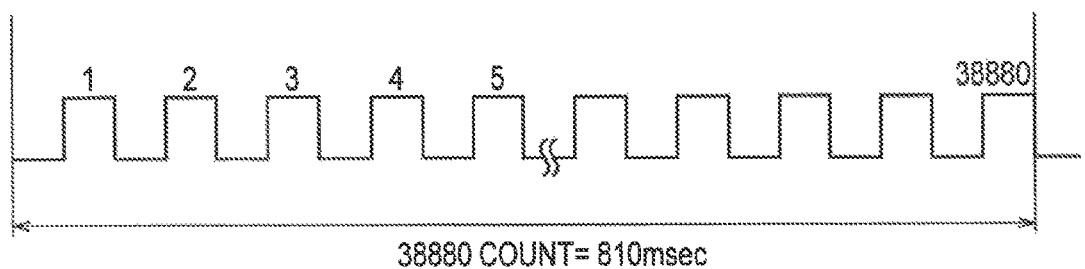
FIG. 7 is a schematic diagram showing an example of timing for ten counts executed in the DC detection circuit according to the embodiment.
Figure 8:
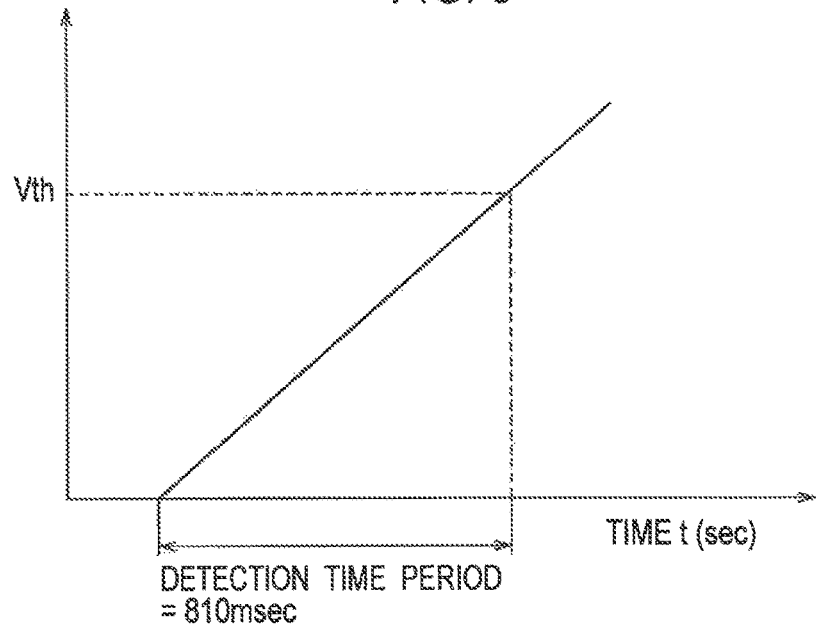
FIG. 8 is a schematic diagram showing an example of a DC detection time period in the DC detection circuit according to the embodiment.
Figure 9:
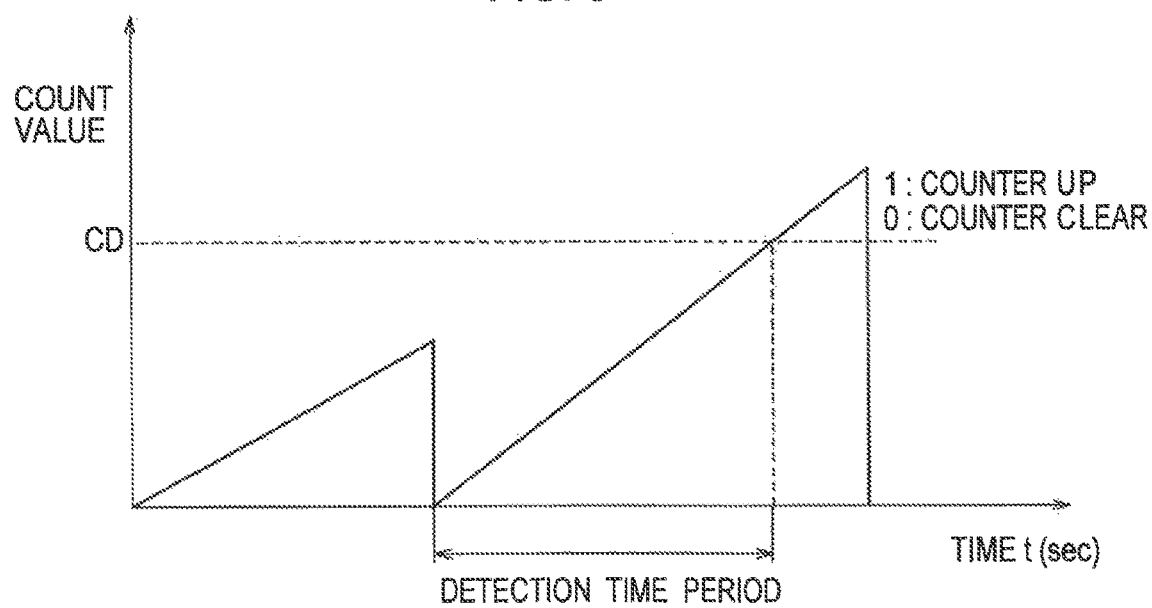
FIG. 9 is a schematic diagram showing an example of count-up and count clearing in the DC detection circuit according to the embodiment.

FIG. 6A shows a configuration example of the selector 134 and the counter 135 provided in the DC detection circuit 130 according to the embodiment, and FIG. 6B schematically shows an example of timing of the counting. Moreover, FIG. 7 schematically shows an example of timing for ten counts, in the DC detection circuit 130 according to the embodiment, Moreover, FIG. 8 schematically shows an example of the DC detection time period in the DC detection circuit 130. Moreover, FIG. 9 schematically shows an example of the count-up processing and count-clearing (reset) processing executed by the counter 135.

In a case where a sampling rate is 48 kHz, if a counter value by the counter 135 is 1, it corresponds to 20.83 μs, and if the counter value is 38880, it corresponds to 810 ms. If the DC detection circuit 130 continues to detect DC data during 38880 counts (810 ms), it is determined that the DC data is included in the input PCM data. For example, time of 810 ms corresponding to a threshold voltage V$^{th}$ is a detection time period. As shown in FIG. 9, if the counter value exceeds count data CD, it is determined as "1" (count-up), and if the counter value does not exceed the count data CD, it is determined as "0" (count-clearing reset)).

Figure 10:
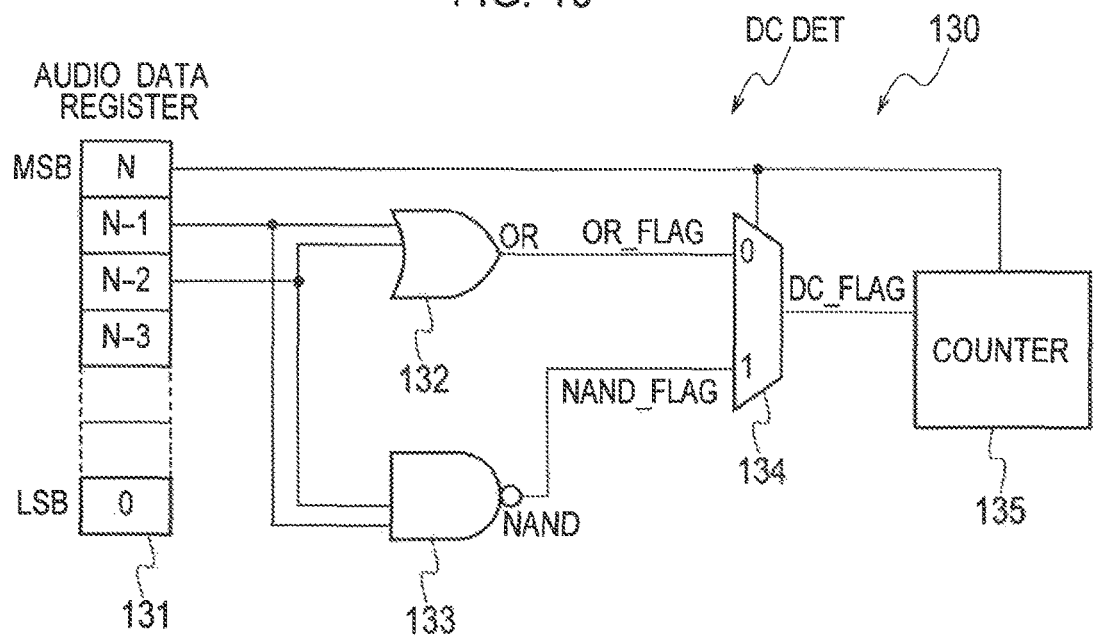
FIG. 10 is a schematic internal configuration diagram showing an example (X=2) of the DC detection circuit according to the embodiment.

FIG. 10 shows schematically an example of an internal configuration of DC detection circuit 130 (variable X=2). Moreover, FIG. 11 schematically shows an example of an internal configuration of the DC detection circuit 130 (variable X=3).

As shown in FIG. 10, in the case of the variable X=2, if 15$^{th}$ MSB corresponds to N$^{th}$ bit, 2 bits from (N−1)$^{th}$ bit to (N−2)$^{th}$ bit (i.e., 14$^{th}$ bit to 13$^{th}$ bit) are supplied into both of the OR circuit 132 and the NAND circuit 133 from the register 131. In this case, since the variable X is "2", the threshold used for the DC detection is approximately −12.04 dB.

Figure 11:
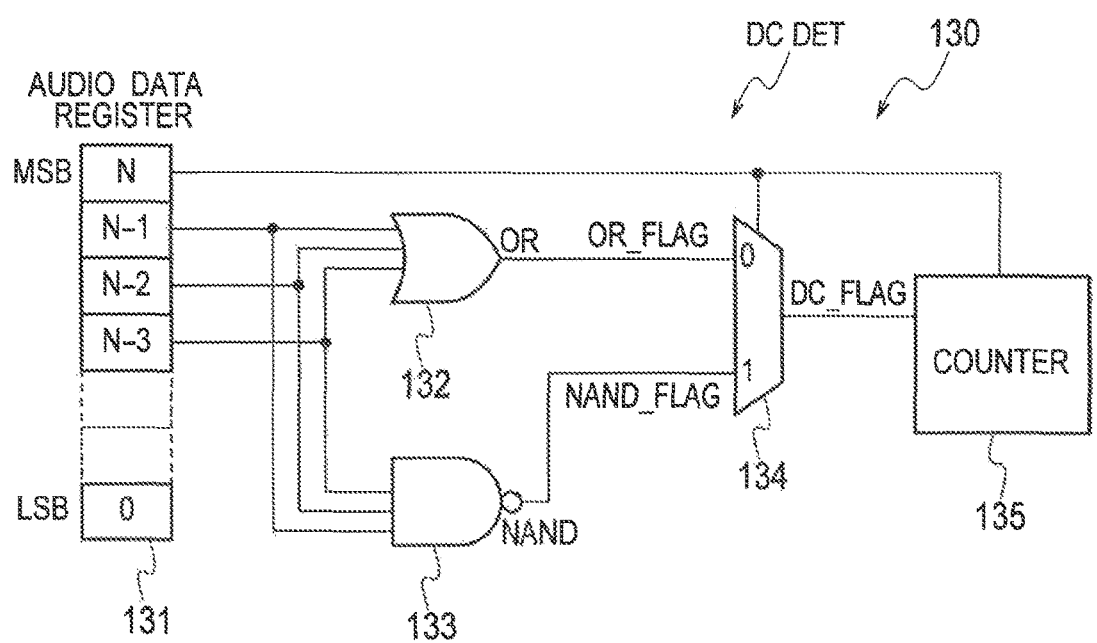
FIG. 11 is a schematic internal configuration diagram showing an example (X=3) of the DC detection circuit according to the embodiment.

Moreover, as shown in FIG. 11, in the case of the variable X is 3, 3 bits from (N−1)$^{th}$ bit to (N−3)$^{th}$ bit (i.e., 14$^{th}$ bit to 12$^{th}$ bit) are supplied into both of the OR circuit 132 and the NAND circuit 133 from the register 131. In this case, since the variable X is "3", the threshold used for the DC detection is approximately −18.06 dB.

Figure 12:
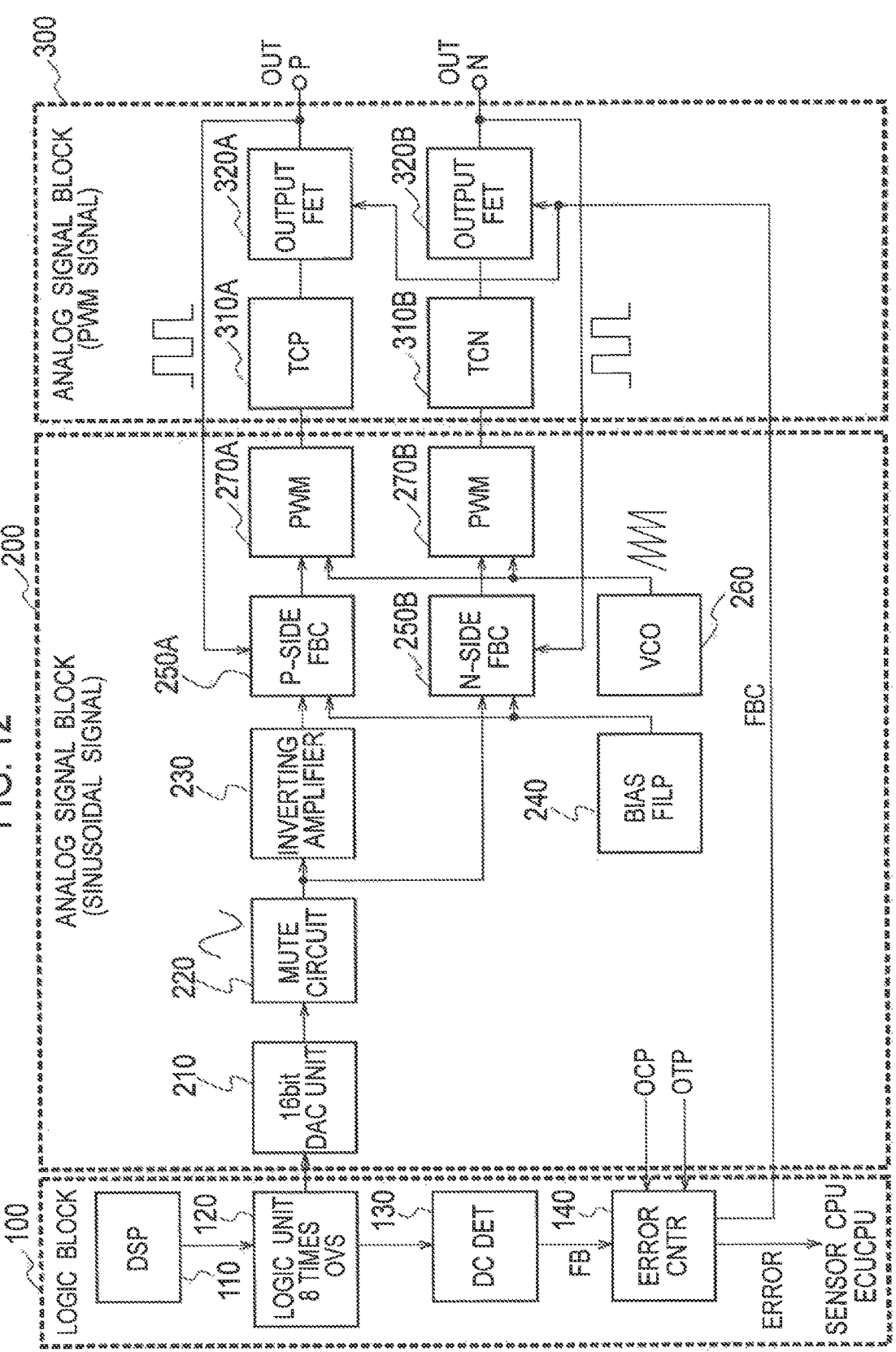
FIG. 12 is a schematic block configuration diagram showing an audio signal output apparatus to which the DC detection circuit according to the embodiment is applied.

Audio Signal Output Apparatus to which DC Detection Circuit and Error Control Circuit are Applied FIG. 12 shows schematically an example of a block configuration of an audio signal output apparatus to which the DC detection circuit 130 according to the embodiment and the error control circuit 140 are applied.

The audio signal output apparatus includes a logic block 100, an analog, signal (sinusoidal signal) block 200, and an analog signal (PWM signal) block 300.

The logic block 100 includes: a DSP 110 configured to input PCM data; a logic unit 8 times OVS 120 connected to the DSP 110; a DC detection circuit 130 connected to the 8 times OVS 120; and an error control circuit 140 connected to the DC detection circuit 130. A load protection flag (FBC) outputted by the error control circuit 140 at the time when the DC data is detected is supplied to respectively output FETs 320A and 320B provided in the analog signal (PWM signal) block 300 mentioned below. An error signal (ERROR) outputted by the error control circuit 140 when the DC data is detected is supplied to CPU, e.g. a sensor, CPU of an engine control unit (ECU), etc., and the CPU, e.g. the sensor, and the CPU of ECU execute processing for protecting a system (e.g., stop of functions, reduction of functions, etc.) as required, in response to the error signal (ERROR).

The analog signal (sinusoidal signal) block 200 includes: MUTE circuit 220 connected to the 8 times OVS 120; an inverting amplifier 230 connected to the MUTE circuit 220; a p-side output feedback control (FBC) circuit 250A configured to input an output of the inverting amplifier 230 and an output of a BIAS flip 240; an n-side output feedback control (FBC) circuit 250B configured to input an output of the MUTE circuit 220 and the output of the BIAS flip 240; a PWM circuit 270A connected to the p-side FBC circuit 250A; and a PWM circuit 270B connected to the n-side FBC circuit 250B. The MUTE circuit 220 is a circuit for preventing pop noises etc. produced at the time of powering on, etc.

The analog signal (PWM signal) block 300 includes: a timing control circuit 310A connected to the PWM circuit 270A; a timing control (TCN) circuit 310B connected to the PWM circuit 270B; an output FET 320A connected to the TCP circuit 3107A; and an output FET 320B connected to the TCN circuit 310B. Outputs from the output FETs 320A and 320B are respectively supplied to external loads (loudspeaker 190 etc.) through output terminals P, N. The load protection flag (FBC) outputted from the error control circuit 140 at the time when the DC data is detected is supplied respectively to the output FETs 320A and 320B, in order to prevent degradation and/or breakage of the external loads (loudspeaker 190 etc.) due to the DC data. The output FETs 320A and 320B execute protection processing of stopping an output process to the external loads (loudspeaker 190 etc.) in response to the load protection flag (FBC) supplied from the error control circuit 140.

Figure 13:
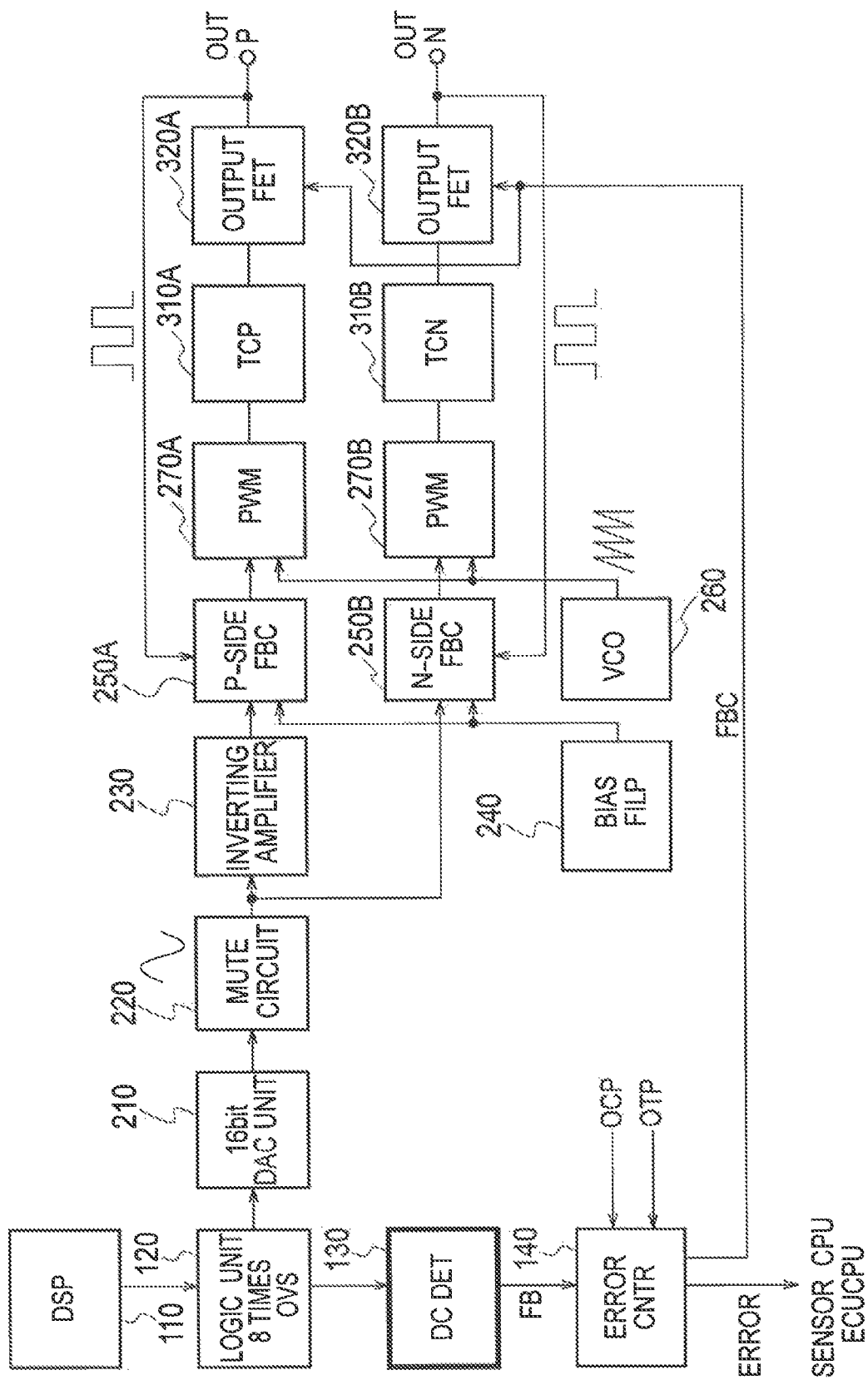
FIG. 13 is a schematic configuration diagram showing the DC detection circuit and the error control circuit (example of a stand-alone configuration) applied to the audio signal output apparatus according to the embodiment.

FIG. 13 schematically shows the DC detection circuit 130 and the error control circuit 140 which are applied to the audio signal output apparatus according to the embodiment, wherein each of the DC detection circuit 130 and the error control circuit 140 is configured as a stand-alone semiconductor device.

Figure 14:
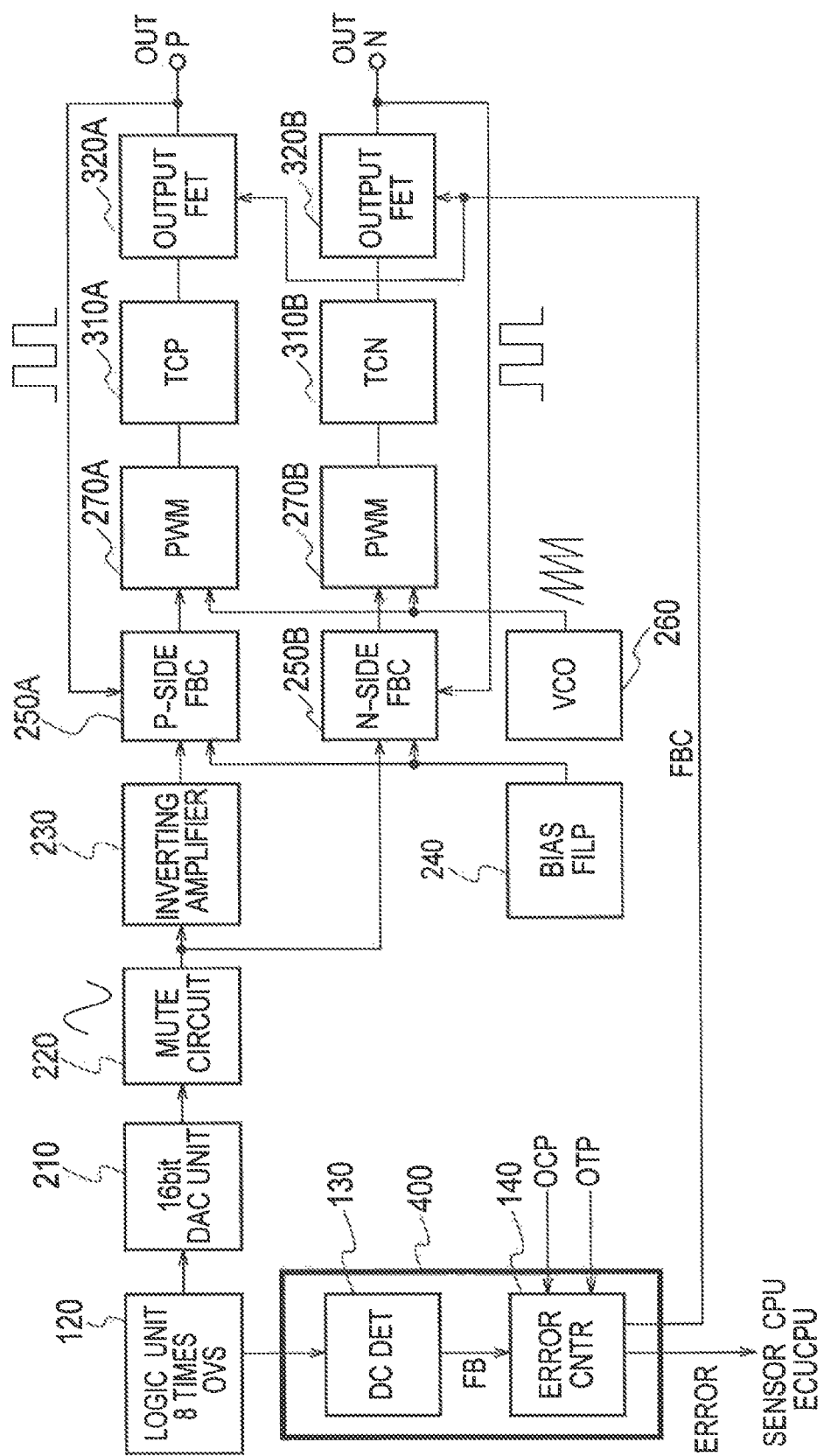
FIG. 14 is a schematic configuration diagram showing the DC detection circuit and the error control circuit (example 1 of an integrated configuration) applied to the audio signal output apparatus according to the embodiment.
Figure 15:
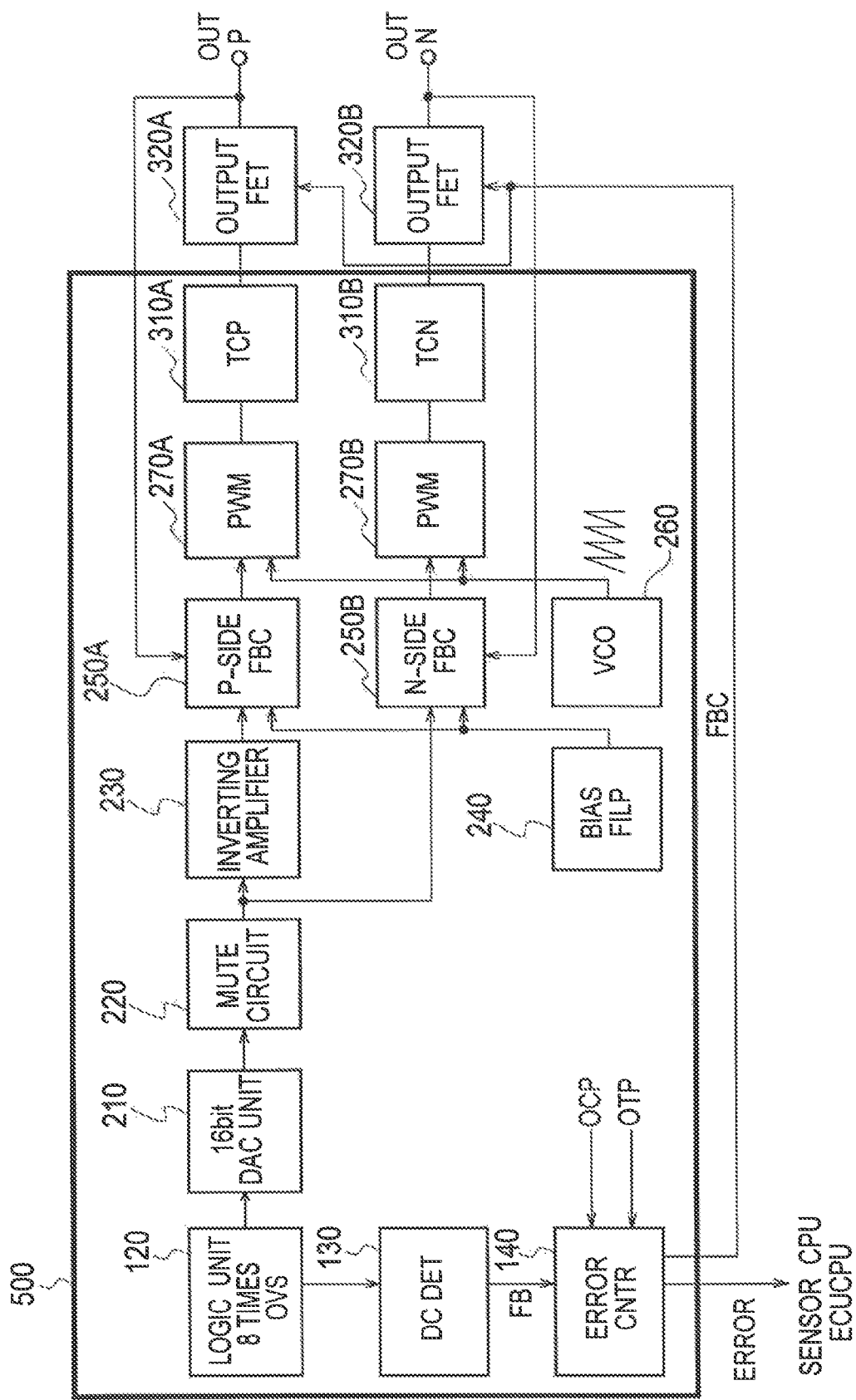
FIG. 15 is a schematic configuration diagram showing the DC detection circuit and the error control circuit (example 2 of the integrated configuration) applied to the audio signal output apparatus according to the embodiment.

FIG. 14 schematically shows a configuration example in which both of the DC detection circuit 130 and the error control circuit 140 are integrated into a semiconductor device 400. FIG. 15 schematically shows a configuration example in which both of the DC detection circuit 130 and the error control circuit 140 are integrated into a semiconductor device 500 with other circuits except the output FETs 320A and 320B.

Operating Method of DC Detection Circuit

Figure 16:
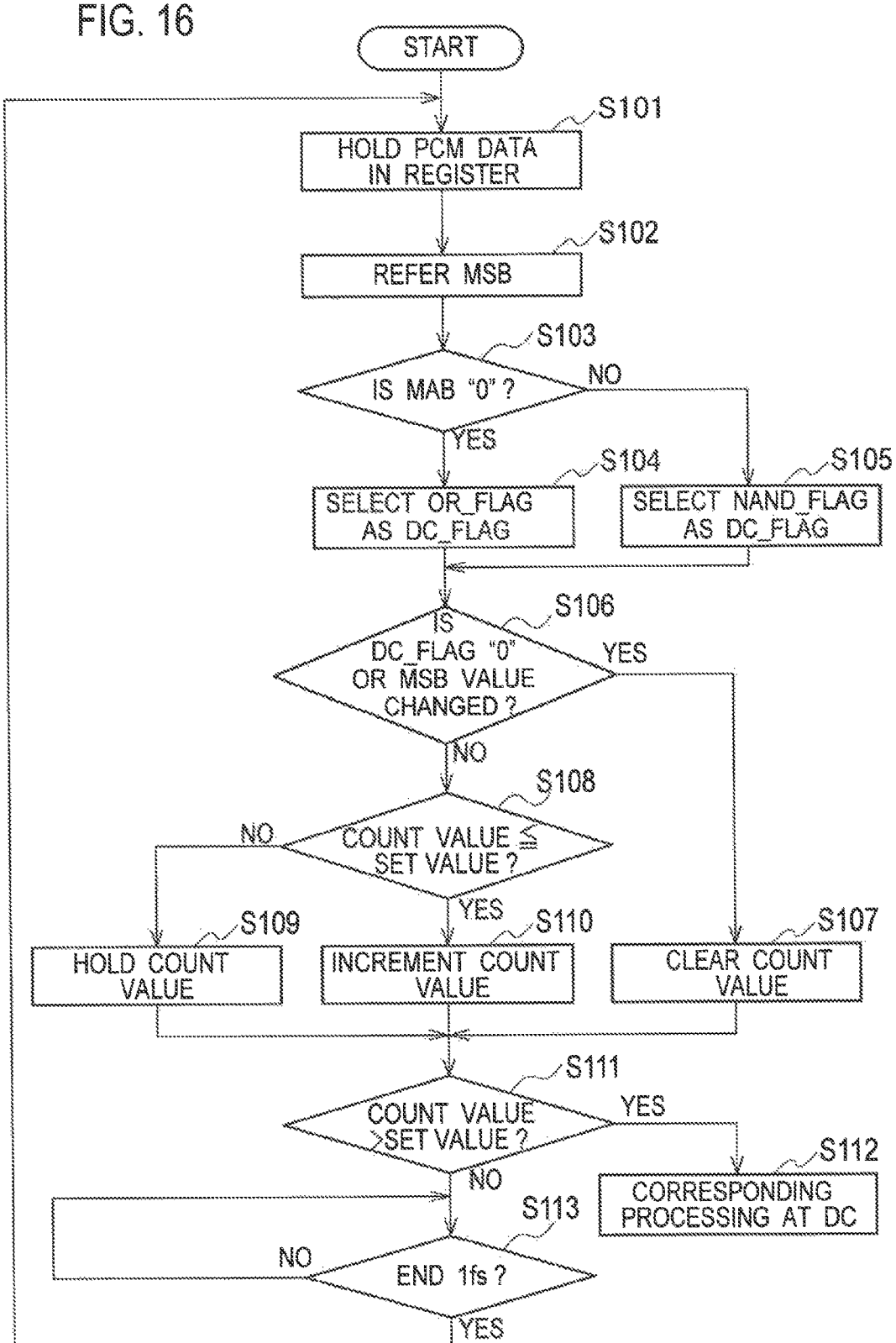
FIG. 16 is a flow chart showing an example of a processing operation of the DC detection circuit according to the embodiment.

FIG. 16 schematically shows an example of a processing operation of the DC detection circuit 130 according to the embodiment.

In Step S101, an input PCM data (output from the OVS 120) is held in the register 131. The OR circuit 132 generates a logical OR flag (OR_FLAG) on the basis of values of X bits from a $(MSB-1)^{th}$ to bit to a $(MSB-X)^{th}$ bit, and the NAND circuit 133 generates an NAND flag (NAND_FLAG) on the basis of the values of X bits from the $(MSB-1)^{th}$ bit to the $(MSB-X)^{th}$ bit.

Next, in Steps S102 to S105, the selector 134 refers to the MSB, and then selects the logical OR flag (OR_FLAG) as a DC flag (DC_FLAG), if the MSB is the logical value "0". Otherwise, if the MSB is the logical value "1", the selector 134 selects the NAND flag (NAND_FLAG) as the DC flag (DC_FLAG).

Next, in Step S106, the counter 135 refers to the MSB and the DC flag (DC_FLAG), and then executes counter processing for every one sampling rate. More specifically, the counter 135 counts up the counter value, if the DC flag (DC_FLAG) is the logical value "1" and the counter value is less than a predetermined set value (Steps S106, S108, S110). If the DC flag (DC_FLAG) is the logical value "1" and the counter value is equal to or greater than the predetermined set value, the counter 135 holds the counter value (Steps S106, S108, S109). If the DC flag (DC_FLAG) is the logical value "0" or the value of MSB is changed, the counter 135 clears the counter value (Steps S106 and S107).

Next, the counter 135 determines whether the counter value exceeds the predetermined set value (Step S111), and then if the counter value exceeds the predetermined set value, the counter 135 regards that DC data is detected, and then outputs the DC detection flag FB (Step S112). The error control circuit 140 executes an over current protection and/or an over temperature protection in response to the DC detection flag FB sent from the DC detection circuit 130, and outputs the load protection flag (FBC) to the output FETs 320A and 320B, and outputs the error signal ERROR to the CPU, e.g. the sensor, the CPU of ECU, etc.

The above-mentioned processing is executed for every sampling rate (1 fs). More specifically, after the above-mentioned processing of the Steps S101 to S111 is completed, and then after standing by until the processing proceeds to the next sampling rate period, it is returned to Step S101 in order to process the next sampling rate period (Step S113).

At this point, the PCM data is updated for every sampling rate (1 fs). If the sampling rate 1 fs is 48 kHz, the data is updated at a cycle of 48 kHz. The counter 135 monitors the DC flag (DC_FLAG) for every fs, and then operates any one count-up/hold/clearing (reset) of the counter value on the basis of the DC flag. The predetermined set value used by the counter 135 is determined in accordance with the time period of executing the DC detection. For example, if the sampling rate 1 fs=48 kHz and the detection time period is 682 ms, the counter value which is 32736 is used as the detected value.

According to the embodiment, the DC detection circuit 130 can be realized by a simplifying and inexpensive structure including only the OR circuit 132, the NAND circuit 133, and the counter 135. Accordingly, the DC detection circuit 130 according to the embodiment can be mounted also in relatively large-sized devices (e.g., device of which a gate width is approximately 0.35 μm).

As explained above, according to the embodiment, there can be provided the DC detection circuit 130, the operating method of the DC detection circuit 130, the semiconductor device, and the audio signal output apparatus, wherein safety can be secured by detecting whether the DC data is included in the input PCM data, and thereby preventing degradation and breakage of the loudspeaker 190 etc. due to the DC data.

Other Embodiments

As explained above, the embodiments and the modified example thereof have been described, as a disclosure including associated description and drawings to be construed as illustrative, not restrictive. This disclosure makes clear a variety of alternative embodiments, working examples, and operational techniques for those skilled in the art.

Such being the case, the embodiments described herein covers a variety of the embodiments, whether described or not.

INDUSTRIAL APPLICABILITY

The DC detection circuit, the operating method of the DC detection circuit, the semiconductor device, and the audio signal output apparatus according to the embodiments are broadly applicable to whole instruments for outputting audios, e.g. television sets, radio sets, radio cassette recorders, car audio systems, home theater systems, audio components, mobile phones, smartphones, electronic musical instruments, etc.

What is claimed is:

1. A DC detection circuit comprising:
   an OR circuit configured to generate a logical OR flag on the basis of a logical OR of values of X bits from a (most significant bit-1)$^{th}$ bit to a (most significant bit-X)$^{th}$ bit of PCM data to be input;
   an NAND circuit configured to generate an NAND flag on the basis of negative AND of values of X bits from the (most significant bit-1)$^{th}$ bit to the (most significant bit-X)$^{th}$ bit of the PCM data; and
   a counter configured to count up a counter value on the basis of the most significant bit and any one of the logical OR flag or NAND flag, and then output a DC detection flag if a counter value exceeds a predetermined set value.

2. The DC detection circuit according to claim 1, further comprising:
   a selector configured to select any one the logical OR flag or the NAND flag, and then output the selected flag as a DC flag on the basis of the most significant bit, wherein
   the counter counts up a counter value on the basis of the most significant bit and the DC flag.

3. The DC detection circuit according to claim 1, further comprising
   a register configured to hold the PCM data, wherein
   the OR circuit and the NAND circuit input the PCM data held by the register.

4. The DC detection circuit according to claim 2, wherein the counter
   counts up the counter value if the DC flag is a logical value "1" and the counter value is less than the predetermined set value,
   holds the counter value if the DC flag is the logical value "1" and the counter value is equal to or greater than the predetermined set value, and
   clears the counter value if the DC flag is a logical value "0" or if the value of the most significant bit is changed.

5. A semiconductor apparatus comprising:
   a DC detection circuit comprising an OR circuit configured to generate a logical OR flag on the basis of a logical OR of values of X bits from a (most significant bit-1)$^{th}$ bit to a (most significant bit-X)$^{th}$ bit of PCM data to be input, an NAND circuit configured to generate an NAND flag on the basis of negative AND of values of X bits from the (most significant bit-1)$^{th}$ bit to the (most significant bit-X)$^{th}$ bit of the PCM data and a counter configured to count up a counter value on the basis of the most significant bit and any one of the logical OR flag or NAND flag, and then output a DC detection flag if a counter value exceeds a predetermined set value; and
   an error control circuit configured to execute a function for protecting a load from an over current and over temperature due to DC data in response to the DC detection flag sent from the DC detection circuit, and then outputs a load protection flag.

6. The semiconductor apparatus according to claim 5, wherein
   the DC detection circuit further comprising a selector configured to select any one the logical OR flag or the NAND flag, and then output the selected flag as a DC flag on the basis of the most significant bit, wherein
   the counter counts up a counter value on the basis of the most significant bit and the DC flag.

7. The semiconductor apparatus according to claim 5, wherein
   the DC detection circuit further comprising a register configured to hold the PCM data, and
   the OR circuit and the NAND circuit input the PCM data held by the register.

8. The semiconductor apparatus according to claim 6, wherein
   the counter
   counts up the counter value if the DC flag is a logical value "1" and the counter value is less than the predetermined set value,
   holds the counter value if the DC flag is the logical value "1" and the counter value is equal to or greater than the predetermined set value, and
   clears the counter value if the DC flag is a logical value "0" or if the value of the most significant bit is changed.

9. An audio signal output apparatus comprising:
   a digital signal processor configured to input PCM data;
   an oversampling filter connected to the digital signal processor;
   a digital/analog converter connected to the oversampling filter;
   a comparator connected to the digital/analog converter;
   a driver output stage connected to the comparator;
   a loudspeaker connected to the driver output stage;
   a DC detection circuit comprising an OR circuit configured to generate a logical OR flag on the basis of a logical OR of values of X bits from a (most significant bit-1)$^{th}$ bit to a (most significant bit-X)$^{th}$ bit of the PCM data, an NAND circuit configured to generate an NAND flag on the basis of negative AND of values of X bits from the (most significant bit-1)$^{th}$ bit to the (most significant bit-X)$^{th}$ bit of the PCM data and a counter configured to count up a counter value on the basis of the most significant bit and any one of the logical OR flag or NAND flag, and then output a DC detection flag if a counter value exceeds a predetermined set value; and an error control circuit configured to execute a function for protecting a load from an over current and over temperature due to DC data in response to the DC detection flag sent from the DC detection circuit, and then outputs a load protection flag to the driver output stage.

10. The audio signal output apparatus according to claim 9, wherein the DC detection circuit further comprising a selector configured to select any one the logical OR flag or the NAND flag, and then output the selected flag as a DC flag on the basis of the most significant bit, wherein the counter counts up a counter value on the basis of the most significant bit and the DC flag.

11. The audio signal output apparatus according to claim 9, wherein the DC detection circuit further comprising a register configured to hold the PCM data, and the OR circuit and the NAND circuit input the PCM data held by the register.

12. The audio signal output apparatus according to claim 10, wherein the counter counts up the counter value if the DC flag is a logical value "1" and the counter value is less than the predetermined set value, holds the counter value if the DC flag is the logical value "1" and the counter value is equal to or greater than the predetermined set value, and clears the counter value if the DC flag is a logical value "0" or if the value of the most significant bit is changed.

13. The audio signal output apparatus according to claim 9, wherein each of the DC detection circuit and the error control circuit is configured as a stand-alone semiconductor device.

14. The audio signal output apparatus according to claim 9, wherein both of the DC detection circuit and the error control circuit are configured to be integrated into a semiconductor device.

15. The audio signal output apparatus according to claim 9, wherein both of the DC detection circuit and the error control circuit are configured to be integrated into a semiconductor device, with the digital signal processor, the oversampling filter, the digital/analog converter, and the comparator.

16. An operational method of a DC detection circuit, the operational method comprising:

generating, by an OR circuit, a logical OR flag on the basis of a logical OR of values of X bits from a (most significant bit-1)$^{th}$ bit to a (most significant bit-X)$^{th}$ bit of PCM data to be input;

generating, by an NAND circuit, an NAND flag on the basis of negative AND of values of X bits from the (most significant bit-1)$^{th}$ bit to the (most significant bit-X)$^{th}$ bit of the PCM data; and counting up, by a counter, a counter value on the basis of the most significant bit and any one of the logical OR flag or NAND flag, and then output a DC detection flag if a counter value exceeds a predetermined set value.

17. The operational method of the DC detection circuit according to claim 16, the operational method further comprising:

selecting, by a selector, any one the logical OR flag or the NAND flag, and then output the selected flag as a DC flag on the basis of the most significant bit, wherein the counter counts up a counter value on the basis of the most significant bit and the DC flag.

18. The operational method of the DC detection circuit according to claim 16, the operational method further comprising:

holding, by a register, the PCM data, wherein the OR circuit and the NAND circuit input the PCM data held by the register.

19. The operational method of the DC detection circuit according to claim 17, wherein the counter counts up the counter value if the DC flag is a logical value "1" and the counter value is less than the predetermined set value, holds the counter value if the DC flag is the logical value "1" and the counter value is equal to or greater than the predetermined set value, and clears the counter value if the DC flag is a logical value "0" or if the value of the most significant bit is changed.

* * * * *